(12) United States Patent
Spurlin et al.

(10) Patent No.: US 9,385,035 B2
(45) Date of Patent: Jul. 5, 2016

(54) CURRENT RAMPING AND CURRENT PULSING ENTRY OF SUBSTRATES FOR ELECTROPLATING

(71) Applicant: Novellus Systems, Inc., Fremont, CA (US)

(72) Inventors: Tighe A. Spurlin, Portland, OR (US); Jian Zhou, West Linn, OR (US); Edward C. Opocensky, Aloha, OR (US); Jonathan Reid, Sherwood, OR (US); Steven T. Mayer, Aurora, OR (US)

(73) Assignee: Novellus Systems, Inc., Fremont, CA (US)

( * ) Notice: Subject to any disclaimer, the term of this patent is extended or adjusted under 35 U.S.C. 154(b) by 586 days.

(21) Appl. No.: 13/987,311

(22) Filed: Jan. 7, 2013

(65) Prior Publication Data

US 2014/0224661 A1 Aug. 14, 2014

Related U.S. Application Data

(66) Continuation-in-part of application No. 12/786,329, filed on May 24, 2010, now Pat. No. 8,500,983, Substitute for application No. 61/181,479, filed on May 27, 2009.

(51) Int. Cl.
*C25D 7/12* (2006.01)
*C25D 17/00* (2006.01)
(Continued)

(52) U.S. Cl.
CPC ............ *H01L 21/76873* (2013.01); *C25D 5/18* (2013.01); *C25D 7/123* (2013.01); *C25D 17/001* (2013.01); *C25D 21/12* (2013.01); *H01L 21/6723* (2013.01)

(58) Field of Classification Search
CPC .................................. C25D 7/12; C25D 7/123
USPC ..................................................... 205/157, 83
See application file for complete search history.

(56) References Cited

U.S. PATENT DOCUMENTS 1,225,395 A 5/1917 Duram
3,849,002 A 11/1974 Hach
(Continued)

FOREIGN PATENT DOCUMENTS

CN 1272685 A 11/2000
CN 101736376 A 6/2010
(Continued)

OTHER PUBLICATIONS

CN Third Office Action dated May 25, 2015 issued in CN 201080023223.X.
(Continued)

*Primary Examiner* — Nicholas A Smith
*Assistant Examiner* — Brian W Cohen
(74) *Attorney, Agent, or Firm* — Weaver Austin Villeneuve & Sampson LLP

(57) ABSTRACT

In some method and apparatus disclosed herein, the profile of current delivered to the substrate provides a relatively uniform current density on the substrate surface during immersion. These methods include controlling the current density applied across a substrate's surface during immersion by dynamically controlling the current to account for the changing substrate surface area in contact with electrolyte during immersion. In some cases, current density pulses and/or steps are used during immersion, as well.

29 Claims, 11 Drawing Sheets

(51) Int. Cl.
*C25D 21/12* (2006.01)
*H01L 21/768* (2006.01)
*H01L 21/67* (2006.01)
*C25D 5/18* (2006.01)

(56) References Cited

U.S. PATENT DOCUMENTS

| | | | |
|---|---|---|---|
| 3,956,120 A | 5/1976 | Kardos et al. |
| 4,092,226 A | 5/1978 | Laing et al. |
| 4,101,919 A | 7/1978 | Ammann |
| 4,229,191 A | 10/1980 | Moore |
| 4,272,335 A | 6/1981 | Combs |
| 4,297,217 A | 10/1981 | Hines et al. |
| 4,459,194 A | 7/1984 | Fletcher et al. |
| 4,461,680 A | 7/1984 | Lashmore |
| 4,563,399 A | 1/1986 | Wright, Jr. |
| 4,975,159 A | 12/1990 | Dahms |
| 5,000,827 A | 3/1991 | Schuster et al. |
| 5,221,449 A | 6/1993 | Colgan et al. |
| 5,252,196 A | 10/1993 | Sonnenberg et al. |
| 5,281,485 A | 1/1994 | Colgan et al. |
| 5,368,711 A | 11/1994 | Poris |
| 5,385,661 A | 1/1995 | Andricacos et al. |
| 5,482,605 A | 1/1996 | Taylor |
| 5,482,611 A | 1/1996 | Helmer et al. |
| 5,618,634 A | 4/1997 | Hosoda et al. |
| 5,831,727 A | 11/1998 | Stream |
| 5,935,762 A | 8/1999 | Dai et al. |
| 5,936,707 A | 8/1999 | Nguyen et al. |
| 5,939,788 A | 8/1999 | McTeer |
| 5,969,422 A | 10/1999 | Ting et al. |
| 5,972,192 A | 10/1999 | Dubin et al. |
| 5,985,762 A | 11/1999 | Geffken et al. |
| 6,004,470 A | 12/1999 | Abril |
| 6,074,544 A | 6/2000 | Reid et al. |
| 6,074,594 A | 6/2000 | Byer et al. |
| 6,099,702 A | 8/2000 | Reid et al. |
| 6,099,711 A | 8/2000 | Dahms et al. |
| 6,099,712 A | 8/2000 | Ritzdorf et al. |
| 6,110,346 A | 8/2000 | Reid et al. |
| 6,113,771 A | 9/2000 | Landau |
| 6,117,784 A | 9/2000 | Uzoh |
| 6,124,203 A | 9/2000 | Joo et al. |
| 6,126,798 A | 10/2000 | Reid et al. |
| 6,132,584 A | 10/2000 | Hubel |
| 6,139,712 A | 10/2000 | Patton et al. |
| 6,140,241 A | 10/2000 | Shue et al. |
| 6,156,167 A | 12/2000 | Patton et al. |
| 6,159,354 A | 12/2000 | Contolini et al. |
| 6,162,344 A | 12/2000 | Reid et al. |
| 6,168,693 B1 | 1/2001 | Uzoh et al. |
| 6,179,973 B1 | 1/2001 | Lai et al. |
| 6,179,982 B1 | 1/2001 | Ting et al. |
| 6,179,983 B1 | 1/2001 | Reid et al. |
| 6,183,888 B1 | 2/2001 | Alperine et al. |
| 6,193,854 B1 | 2/2001 | Lai et al. |
| 6,197,179 B1 | 3/2001 | Arlt et al. |
| 6,197,181 B1 | 3/2001 | Chen |
| 6,203,684 B1 | 3/2001 | Taylor et al. |
| 6,217,716 B1 | 4/2001 | Fai Lai |
| 6,221,757 B1 | 4/2001 | Schmidbauer et al. |
| 6,251,242 B1 | 6/2001 | Fu et al. |
| 6,261,433 B1 | 7/2001 | Landau |
| 6,274,008 B1 | 8/2001 | Gopalraja et al. |
| 6,277,249 B1 | 8/2001 | Gopalraja et al. |
| 6,297,157 B1 | 10/2001 | Lopatin et al. |
| 6,309,528 B1 | 10/2001 | Taylor et al. |
| 6,395,101 B1 | 5/2002 | Scranton et al. |
| 6,413,388 B1 | 7/2002 | Uzoh et al. |
| 6,503,376 B2 | 1/2003 | Toyoda et al. |
| 6,540,899 B2 | 4/2003 | Keigler |
| 6,551,487 B1 | 4/2003 | Reid et al. |
| 6,562,204 B1 | 5/2003 | Mayer et al. |
| 6,569,299 B1 | 5/2003 | Reid |
| 6,582,578 B1 | 6/2003 | Dordi et al. |
| 6,592,737 B1 | 7/2003 | Robertson |
| 6,746,591 B2 | 6/2004 | Zheng et al. |
| 6,793,796 B2 | 9/2004 | Reid et al. |
| 6,796,877 B1 | 9/2004 | Bingham et al. |
| 6,800,187 B1 | 10/2004 | Reid et al. |
| 6,911,136 B2 * | 6/2005 | Zheng ............... H01L 21/2885 205/134 |
| 6,913,680 B1 * | 7/2005 | Zheng ............... C25D 5/18 205/102 |
| 6,946,065 B1 | 9/2005 | Mayer et al. |
| 6,964,792 B1 | 11/2005 | Mayer et al. |
| 7,097,410 B1 | 8/2006 | Reid et al. |
| 7,686,927 B1 | 3/2010 | Reid et al. |
| 7,727,863 B1 | 6/2010 | Buckalew et al. |
| 7,879,218 B1 * | 2/2011 | Webb ............... C25D 5/34 205/210 |
| 8,048,280 B2 | 11/2011 | Mayer et al. |
| 8,500,983 B2 | 8/2013 | Ponnuswamy et al. |
| 9,028,666 B2 | 5/2015 | Ranjan et al. |
| 2002/0029973 A1 | 3/2002 | Maydan |
| 2002/0084183 A1 | 7/2002 | Hanson et al. |
| 2002/0084189 A1 | 7/2002 | Wang et al. |
| 2003/0102223 A1 | 6/2003 | Shimo et al. |
| 2003/0183527 A1 | 10/2003 | Collins |
| 2004/0016637 A1 * | 1/2004 | Yang ............... A23D 7/00 204/242 |
| 2004/0206628 A1 | 10/2004 | Lubomirsky et al. |
| 2005/0183959 A1 * | 8/2005 | Wilson ............... C23C 14/545 205/123 |
| 2006/0011483 A1 | 1/2006 | Mayer et al. |
| 2006/0201814 A1 | 9/2006 | Hafezi et al. |
| 2007/0080067 A1 | 4/2007 | Gu et al. |
| 2007/0261963 A1 | 11/2007 | Han et al. |
| 2008/0057211 A1 | 3/2008 | Chen et al. |
| 2008/0149489 A1 | 6/2008 | Varadarajan et al. |
| 2009/0038950 A1 | 2/2009 | Zhang-Beglinger et al. |
| 2010/0300888 A1 | 12/2010 | Ponnuswamy et al. |
| 2012/0090987 A1 * | 4/2012 | Gorer ............... C25D 17/001 204/212 |
| 2012/0292192 A1 | 11/2012 | Ranjan et al. |
| 2014/0224661 A1 | 8/2014 | Spurlin et al. |
| 2015/0218727 A1 | 8/2015 | Ranjan et al. |

FOREIGN PATENT DOCUMENTS

| | | |
|---|---|---|
| KR | 2002-0060716 | 7/2002 |
| WO | WO99/41434 | 8/1999 |
| WO | WO01/29548 | 4/2001 |
| WO | WO2010/138465 | 12/2010 |

OTHER PUBLICATIONS

US Office Action dated Dec. 18, 2001 issued in U.S. Appl. No. 09/597,848.

US Final Office Action dated Jun. 4, 2002 issued in U.S. Appl. No. 09/597,848.

US Office Action, dated Apr. 18, 2012, issued in U.S. Appl. No. 12/786,329.

US Final Office Action, dated Feb. 25, 2013, issued in U.S. Appl. No. 12/786,329.

US Notice of Allowance, dated Apr. 26, 2013, issued in U.S. Appl. No. 12/786,329.

PCT International Search Report and Written Opinion dated Dec. 23, 2010 issued in Application No. PCT/US2010/035991.

PCT International Preliminary Report on Patentability and Written Opinion dated Dec. 8, 2011 issued in Application No. PCT/US2010/035991.

CN First Office Action dated Dec. 4, 2013 issued in CN 201080023223.X.

CN Second Office Action dated Jul. 7, 2014 issued in CN 201080023223.X.

CN Third Office Action dated Dec. 3, 2014 issued in CN 201080023223.X.

KR Office Action dated Apr. 30, 2012 issued in Application No. 10-2011-7031103.

KR Office Action (Notice of first Refusal Ruling) dated Dec. 5, 2012 issued in Application No. 10-2011-7031103.

(56) References Cited

OTHER PUBLICATIONS

TW Office Action dated Dec. 18, 2012 issued in Application No. 099117062.
TW Office Action dated Jun. 24, 2013 issued in Application No. 099117062.
TW Office Action dated Apr. 9, 2014 issued in Application No. 099117062.
Akolkar et al., "Pattern Density Effect on the Bottom-Up Fill During Damascene Copper Electrodeposition," Electrochemical and Solid-State Letters, vol. 10, No. 6 (2007), pp. D55-D59.
Mayer, Steven Thomas, "Theories of Nucleation and Growth by Electrocrystalization," An In Situ Study of the Anodic Film Formation of Cu, Ag, and Zn in Alkaline Media, Lawrence Berkeley National Laboratories Report No. LBL 28085, Dec. 1, 1989, Chapter 4, 38 pp.
West et al., "Pulse Reverse Copper Electrodeposition in High Aspect Ratio Trenches and Vias," J. Electrochem. Soc., Sep. 1998, 5 pp.
U.S. Appl. No. 14/664,652, filed Mar. 20, 2015 entitled "Control of Current Density in an Electroplating Apparatus."
U.S. Appl. No. 14/686,479, filed Apr. 14, 2015 entitled "Wetting Wave Front Control for Reduced Air Entrapment During Wafer Entry Into Electroplating Bath."
U.S. Office Action dated Oct. 3, 2002 issued in U.S. Appl. No. 09/872,341.
US Notice of Allowance dated Feb. 5, 2003 issued in U.S. Appl. No. 09/872,341.
U.S. Office Action dated Jun. 27, 2005 issued in U.S. Appl. No. 10/379,858.
U.S. Final Office Action dated Dec. 14, 2005 issued in U.S. Appl. No. 10/379,858.
U.S. Notice of Allowance dated Jun. 8, 2006 issued in U.S. Appl. No. 10/379,858.
U.S. Office Action dated Jun. 26, 2009 issued in U.S. Appl. No. 11/510,048.
U.S. Notice of Allowance dated Nov. 19, 2009 issued in U.S. Appl. No. 11/510,048.
US Office Action dated May 28, 2002 issued in U.S. Appl. No. 09/716,016.
US Office Action dated Jan. 6, 2003 issued in U.S. Appl. No. 09/716,016.
US Final Office Action dated Feb. 4, 2004 issued in U.S. Appl. No. 09/716,016.
US Notice of Allowance dated Apr. 21, 2004 issued in U.S. Appl. No. 09/716,016.
US Office Action dated Jun. 10, 2009 issued in U.S. Appl. No. 11/228,712.
US Final Office Action dated Jan. 7, 2010 issued in U.S. Appl. No. 11/228,712.
US Office Action dated Oct. 12, 2010 issued in U.S. Appl. No. 11/228,712.
US Final Office Action dated Apr. 29, 2011 issued in U.S. Appl. No. 11/228,712.
US Notice of Allowance dated Aug. 16, 2011 issued in U.S. Appl. No. 11/228,712.
US Office Action dated Jul. 19, 2013 issued in U.S. Appl. No. 13/286,103.
US Final Office Action dated Nov. 8, 2013 issued in U.S. Appl. No. 13/286,103.
US Notice of Allowance dated Jan. 20, 2015 issued in U.S. Appl. No. 13/460,423.
Chang, C.Y. and Sze, S.M., Editors (1996) "ULSI Technology," Eds, *McGraw-Hill*, 1996, pp. 444-445.
Contolini, Robert J., Tarte, Lisa, Graff, Robert T., Evans, Lee B., Cox, J. Neal, Puich, Marc R., Gee, Justin E., Mu, Xiao-Chun, Chiang, Chien (Jun. 27-29, 1995) "Copper Electroplating Process for Sub-Half-Micron ULSI Structures," *VMIC Conf.* pp. 322-325.
Dubin, Valery M., Shacham-Diamand, Yosi, Zhao, Bin, Vasudev, P.K., Ting, Chiu H. (Jun. 26 & 27, 1995) "Selective and Blanket Electroless Cu Plating Initiated by Contact Displacement for Deep Submicron Via Contact Filling," *VMIC Conf.* pp. 314-321.
Lowenheim, Fredereick A., (1978) "Electroplating," *McGraw-Hill Book Company*, pp. 128-129.
Lowenheim, Fredereick A., (1978) "Electroplating," *McGraw-Hill Book Company*, p. 423.
Rose, Arthur et al., (1968) "The Condensed Chemical Dictionary," Seventh Edition, Van Nostrand Reinhold Book Corporation, New York, p. 908.
US Office Action dated Dec. 4, 2015 issued in U.S. Appl. No. 14/686,479.
Chinese First Office Action dated Oct. 9, 2015 issued in Application No. CN 201210153279.8.

\* cited by examiner

CURRENT RAMPING AND CURRENT PULSING ENTRY OF SUBSTRATES FOR ELECTROPLATING

CROSS-REFERENCE TO RELATED APPLICATIONS

This application is a continuation-in-part of U.S. application Ser. No. 12/786,329 (now U.S. Pat. No. 8,500,983), titled "PULSE SEQUENCE FOR PLATING ON THIN SEED LAYERS," filed May 24, 2010, which claims the benefit of priority of U.S. Provisional Application No. 61/181,479, titled "PULSE SEQUENCE FOR PLATING ON THIN SEED LAYERS," filed May 27, 2009.

BACKGROUND

Various aspects disclosed herein relate to methods of controlling the current profile and thereby controlling the metal deposition on substrates as they enter electroplating solutions. The current profile is the current delivered to the substrate as a function of time while the substrate is being immersed in the electroplating solution. Because the substrate is tilted from the horizontal plane during immersion in many implementations, the substrate is generally not instantaneously immersed. Instead, the substrate gradually becomes more immersed as it is lowered into the electrolyte. In some embodiments, the time for immersion represents a significant fraction of the total time for electroplating metal onto the substrate.

SUMMARY

In some methods, the profile of current delivered to the substrate provides a relatively uniform current density on the substrate surface during immersion. These methods include controlling the current density applied across a substrate's surface during immersion by dynamically controlling the current to account for the changing substrate surface area in contact with electrolyte during immersion.

DETAILED DESCRIPTION

Figure 1A:
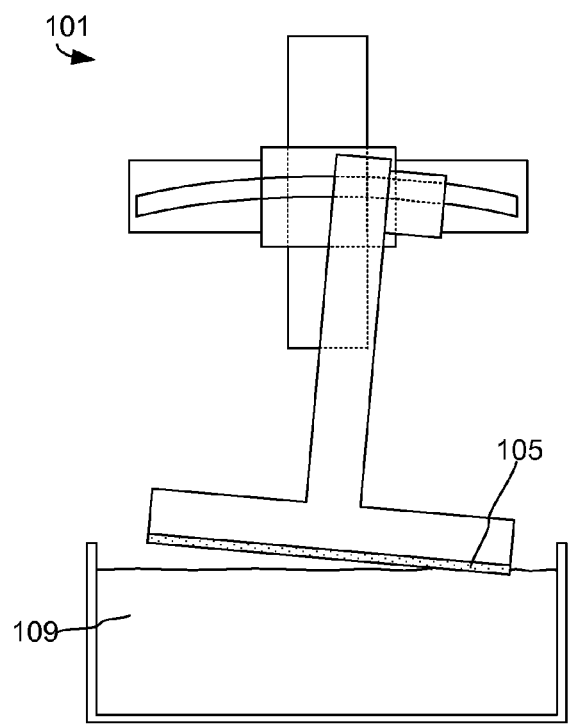
FIG. 1A shows a simplified version of a substrate positioning system immersing a substrate in electrolyte in an angled orientation.

Although many of the examples herein relate specifically to copper deposition on semiconductor substrates, the embodiments are not so limited. Rather, the techniques are applicable to the deposition of a wide range of metals on a wide range of substrates. Such other metals include nickel, cobalt, tin, silver, copper, gold, and alloys of copper with manganese, magnesium, and aluminum.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon or other semiconductor wafer during any of many stages of integrated circuit fabrication thereon. The terms "electrolyte," "plating solution," "electroplating solution," "plating bath," and "bath" are also used interchangeably. The following detailed description assumes the invention is implemented on a wafer. However, as noted above, the invention is not so limited. The work piece may be of various shapes, sizes, and materials. In addition to semiconductor wafers, other work pieces that may take advantage of this invention include various articles such as back planes and other components of displays, printed circuit boards and the like.

Currently, integrated circuit (IC) fabrication employs damascene, dual-damascene, or related technology for electroplating copper or other current carrying metal into recesses such as trenches and vias that define interconnect paths. One process step used in producing copper damascene circuits is the formation of a "seed-" or "strike-" layer, which is then used as a base layer onto which copper is electroplated (electrofilled). The seed layer carries the electrical plating current from the edge region of the wafer (where electrical contact is made) to all trench and via structures located across the wafer surface. Trenches, vias, and other recesses are sometimes referred to as "features." The seed film is typically a thin conductive copper layer. It is separated from insulating silicon dioxide or other dielectric by a barrier layer. In some applications, a thin seed layer serves as both a diffusion barrier and a conductive seed. Examples of materials that may be used in such dual-function layers include certain alloys of copper, ruthenium, tungsten, cobalt and tantalum.

As semiconductor industry advances, technology nodes are moving towards a very thin and resistive seed regime for electrochemical fill. It becomes very challenging to achieve uniform initial plating across the wafer with such resistive seed layers. Thin seed layers may contain discontinuities and may be degraded by exposure to the atmosphere or the electroplating solution. To provide current during electroplating, the plating tool makes electrical contact to the conductive seed layer only in the edge region of the substrate. Because, the potential of a thin seed layer may vary from the edge to the center of the substrate, achieving uniform electrofill rates over the wafer surface is a significant challenge. The non-uniform plating thickness will be even more pronounced as the industry transitions from 300 mm wafer to 450 mm wafer.

During the entry phase, the seed layer within small features on a wafer surface is subject to corrosion reactions, crystal redistribution, and in general, removal of seed material from the bottom regions of trenches and vias. One goal in electroplating is to avoid etching or corrosion of the seed layer within the trenches or vias while achieving full wetting of the surface. Corrosion of the seed layer during the entry phase may be mitigated by cathodically polarizing the seed layer with respect to the electrolyte solution. Cathodic polarization during immersion and prior to electroplating has been shown to provide significant metallization fill advantages as compared to immersion with no applied current (i.e., "cold entry").

The cathodic polarization may be achieved by pre-setting a power supply connected to the wafer to provide a small DC cathodic current at a current density in the range of, for example, about 0.02 to 5 mA/cm$^2$ just as, or as quickly as possible after, the wafer is immersed in the electrolyte. In a second method, polarization is achieved by applying a slightly negative DC cathodic constant voltage with respect to a reference electrode in the electrolyte at, for example, 40 mV, prior to the wafer making contact with the acidic electrolyte. Polarization during entry is further discussed in U.S. Pat. No. 6,793,796, incorporated by reference herein in its entirety.

The careful control of current density across the plating face of a substrate during its initial entry into electrolyte is beneficial in producing void-free filling of integrated circuit devices with uniform plating thickness across the wafer surface. As explained, the process of immersing substrates into electroplating solution may tilt the substrate away from horizontal. Consequently, the substrate will have a leading edge and a trailing edge during immersion. If a constant current bias is applied to the substrate during immersion, the leading edge will experience a very high current density (potentially dangerously high) until the most or all of the substrate is immersed. Even if the high current density does not damage the leading edge of the wafer, the higher current densities during entry result in leading edge portions of the substrate having higher rates of metal deposition, and a non-uniform film thickness over the substrate surface.

Potentiostatic wafer entry has been used to help control the current density across the wafer during immersion. Potentiostatic entry involves application of a constant potential to the wafer during the entire course of entry into the electroplating solution. The potentiostatic wafer entry technique is further described in U.S. Pat. No. 6,551,483, filed May 10, 2001, U.S. Pat. No. 6,946,065 filed Nov. 16, 2000, and U.S. Pat. No. 8,048,280, filed Sep. 16, 2005, each incorporated by reference herein in its entirety. In some implementations, the potentiostatic control during entry produces current densities of about 1 to 40 mA/cm$^2$ across the face of the wafer. Immersion of the wafer under potentiostatic conditions helps protect the seed layer from corrosion, particularly in acidic plating solutions (e.g., electrolytes having 10-150 g/L acid). Potentiostatic entry has also been employed to help control the start of metal nucleation on the seed, which is then propagated through multiple plating steps to fully metallize integrated circuit devices without forming voids or seams. This method is further discussed in U.S. Pat. No. 6,074,544, filed Jul. 22, 1998, and incorporated by reference herein in its entirety. Because controlled potential methods such as potentiostatic entry allow tighter control of the current density across a wafer during immersion, these methods have been shown to provide significant metallization fill advantages as compared to immersion with a constant applied current (i.e., "hot entry").

Still, certain challenges with simple potentiostatic substrate entry have been observed. First, potentiostatic entry provides only limited control of the current density across the surface of a wafer as it enters a plating bath. Consequently, potentiostatic entry results in increased plating on portions of the wafer that are exposed to higher current densities during immersion, and decreased plating on portions of the wafer that are exposed to lower current densities during immersion. Furthermore, due to the non-uniform film thickness resulting from potentiostatic entry, there may be a relatively high number of defects introduced through chemical mechanical polishing of the substrate after deposition. Another problem sometimes encountered with potentiostatic entry is the formation of voids or other defects along the sidewalls of semiconductor features due to wafer regions that are exposed to lower current densities, which provide poorer seed protection. Higher current densities better protect seed layers in corrosive plating solutions and drive rapid nucleation of metal. The voids are most likely to occur on the sidewalls of features because, due to the nature of the physical vapor deposition (PVD) process used to deposit the seed layer, the metal seed is likely to be thinnest at these locations and therefore most prone to dissolution. The dissolution of the seed layer on the sidewalls of a feature due in part to a relatively low current density may lead to the formation of voids at these locations.

Embodiments herein provide methods of dynamically controlling the current profile during substrate immersion to account for the changing surface area of the substrate that is in contact with the electrolyte during this period. Because substrates typically enter the electrolyte at a slight angle relative to the surface of the electrolyte, the wafer does not instantaneously become fully immersed. Angled immersion is further described in U.S. Pat. No. 6,551,487, filed May 31, 2001, and U.S. Patent Publication No. 2012/0292192, titled "WETTING WAVE FRONT CONTROL FOR REDUCED AIR ENTRAPMENT DURING WAFER ENTRY INTO ELECTROPLATING BATH", filed Apr. 30, 2012, each of which is incorporated by reference herein in its entirety. Due to the angled immersion, the leading edge of the wafer becomes immersed before the trailing edge of the wafer. The surface area of the substrate that is immersed in electrolyte (i.e., the "immersed area") increases over the course of immersion. For substrates of many shapes, the rate of surface area increase is non-linear.

FIG. 1A shows a plating apparatus 101 during angled immersion of a substrate 105 in electrolyte 109. Apparatus 101 moves wafer 105 along an axis normal to the surface of an electrolyte 109 and tilts the wafer from horizontal, allowing for angled immersion. The use of a virtual pivot is one embodiment of the tilting capability of the invention. Other embodiments may use actual pivot joints located in the vicinity of the wafer. Typically, the apparatus provides two distinct movement capabilities: vertical movement along a vertical trajectory normal to the electrolyte and a tilting movement of the wafer. As mentioned, the tilted immersion may reduce the formation or residence of bubbles on the wafer surface during immersion. Bubbles on the wafer surface during electroplating block plating at the locations where the bubbles attach. This produces defects on the face of the wafer.

Figure 1B:
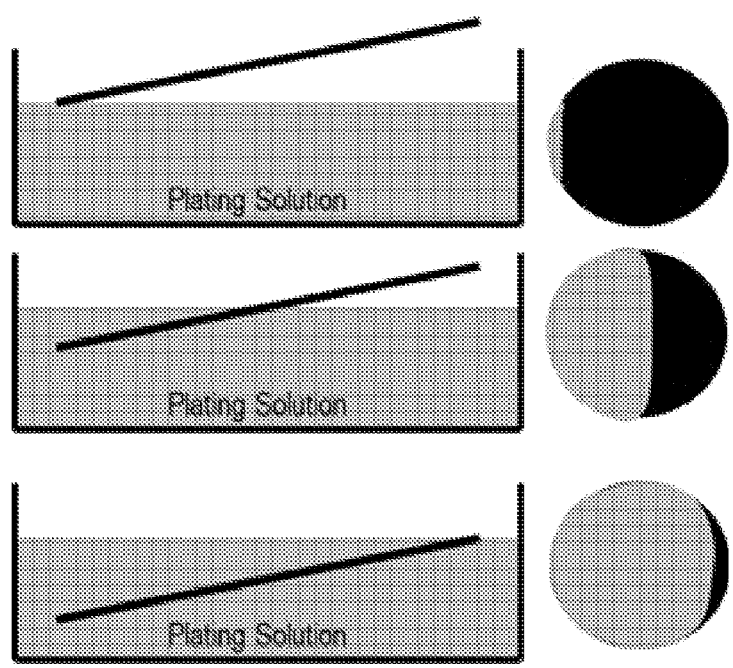
FIG. 1B shows a substrate being immersed in electrolyte at three different points in time.

FIG. 1B illustrates a typical angled immersion of a substrate at three points in time and the corresponding immersed area of the substrate. In these wafer representations, the dark areas corresponds to areas of the wafer that have not yet been immersed, while the light areas correspond to the wafer's immersed area. In the upper panel of FIG. 1A, the substrate is just beginning to enter the plating solution (the "entry edge" is immersed). In the middle panel, the wafer is approximately half way immersed (the "middle of wafer" is immersed), and in the lower panel, the substrate is almost fully immersed (the "immersed edge" is nearly immersed).

By taking the increasing immersed area into account, better control of the current density applied to the wafer during immersion can be achieved. In other words, entry methods that provide control of the current as a function of immersed area provide significantly better control of the film uniformity and morphology than simple potentiostatic entry methods. For example, such methods allow better control of the initial metal nucleation, which drives uniform film growth that occurs in subsequent plating steps after immersion. The resulting films exhibit more uniform thickness and lower average roughness because all areas of the wafer experience more uniform plating conditions (e.g., current density), as compared to films plated under potentiostatic entry conditions. Because the resulting films are more uniform in thickness, fewer defects are introduced. Another advantage to the present approach is that a constant relatively high current density may be applied to the surface of the wafer, thereby providing better protection against seed dissolution and sidewall void formation as rapid nucleation of metal will occur over the entire wafer surface.

Figure 2:
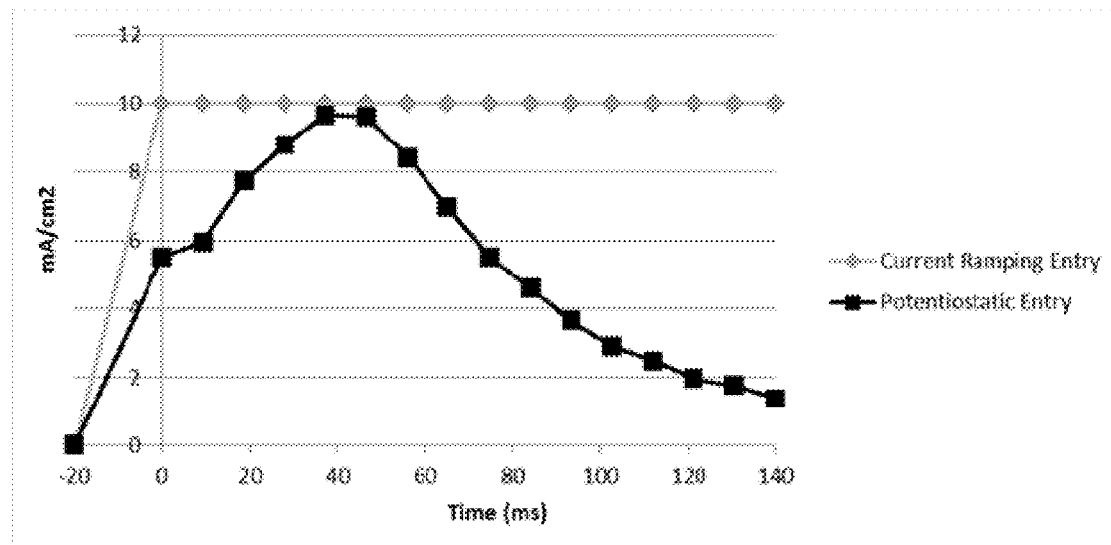
FIG. 2 is a graph illustrating current density during different immersion methods.

FIG. 2 shows the current densities applied across the face of a wafer as it is first immersed in a bath for two methods: (1) a conventional potentiostatic entry (shown by the dark squares), and (2) a current ramping entry according to the embodiments disclosed herein (shown by the light diamonds). The wafer enters the solution at time=0 ms. Before this time, the wafer is approaching the solution. The wafer is about halfway immersed after about 40 to 50 ms and is fully immersed after about 100 ms. Notably, the current density varies significantly over the course of immersion where potentiostatic entry is used. The uniformity of current density is significantly increased when the current ramping entry is used.

Figure 3:
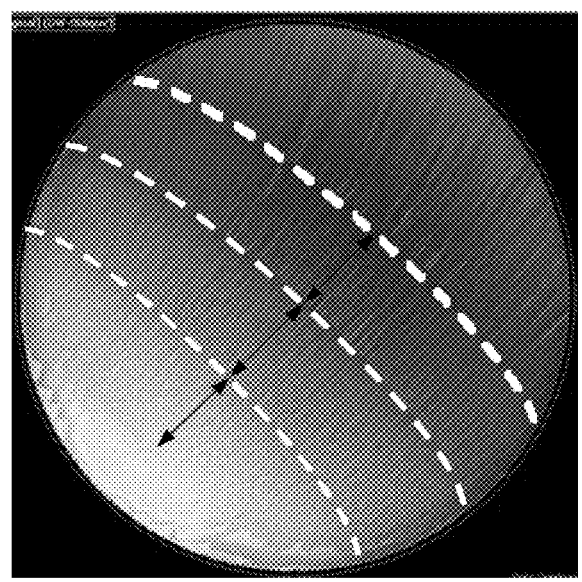
FIG. 3 shows a haze map of a substrate that experienced distinct current steps during immersion.

In certain embodiments, the entry profile of the wafer surface area is determined. The entry profile tracks the immersion area over the course of immersion. There are various analytical methods of determining the entry profile. In one method, the immersed area is calculated algebraically as a function of time based on the substrate's vertical entry speed, angle of immersion and rotation rate. In certain instances the substrate's rotation rate has a negligible impact on the immersion area and may be ignored. In another method, an experimental technique is used. For example, during immersion of a test wafer, a series of defined current pulses may be applied to the surface of the test wafer. The current pulses result in well-defined lines where the metal deposition is disrupted. Commonly used metrology tools may be used to analyze the test wafer. For example, FIG. 3 shows a haze map generated by a Surface Scan SP2 from KLA Tencor of Milpitas, Calif., which analyzes the light scattering off a wafer surface. The haze map of FIG. 3 corresponds to a test wafer that experienced defined current pulses during immersion, with an immersion speed of 6 cm$^2$/ms. The dotted white lines illustrate where a current pulse began and the metal deposition was disrupted. The black arrows represent the known time between current pulses. This method may be used to calculate the immersed area as a function of time for a particular set of entry conditions (e.g., vertical entry speed, angle, rotation rate, etc.), and may be especially useful where more complex entry patterns are used (e.g., where the vertical entry speed and/or immersion angle are dynamic). In this way, haze maps or other experimental data representing variations in current density may be used to create a reference database that may be used to calculate the amount of current that should be applied to the substrate at a given time, for a particular set of entry conditions. The test data throughout the instant disclosure was collected using unpatterned wafers with well-defined surface areas. Patterned wafers will have larger surface areas due to the features present on the wafer surface.

The embodiments herein may be used with a wide range of vertical entry speeds. In certain implementations, the entry speed may be between about 75 and 600 cm/s for a substrate immersed at a fixed angle (e.g., about 1-5° from the horizontal). The entry speed, in terms of area immersed per time, may be constant or it may vary over time. In certain embodiments, the entry speed is between about 2 and 700 cm$^2$/ms. Although the entry speeds explicitly disclosed in the examples herein are between about 3-7.5 cm$^2$/ms, the implementations are not so limited. Certain embodiments utilize entry speeds that are less than or greater than this range.

For circular wafers, a constant vertical immersion rate (vertical position per unit time) produces an initially slow areal entry rate followed by a faster rate as the wafer center approaches the electroplating bath and then slows after the wafer center has been immersed. In some embodiments, the areal entry speed may start at a high rate and transition to a slower rate as the wafer is immersed. In other embodiments, it may be beneficial to have a low areal entry speed at the beginning of immersion and a higher entry speed at the end of immersion. In yet other embodiments, it may be beneficial to have a high areal entry speed at the beginning and end of immersion, coupled with a slow entry speed during the middle portion of the immersion process.

Further, the embodiments herein may be practiced at a wide range of current densities. In most embodiments, the current density may be between about 0.1 and 500 mA/cm$^2$. The current density may be fairly constant over time in certain implementations, or it may be more dynamic.

In certain embodiments, when applying current ramping techniques to patterned wafers, the applied current densities are increased by a factor of about 2-5 (as compared to the current densities tested and disclosed herein) in order to compensate for the increased surface area.

Figure 4A:
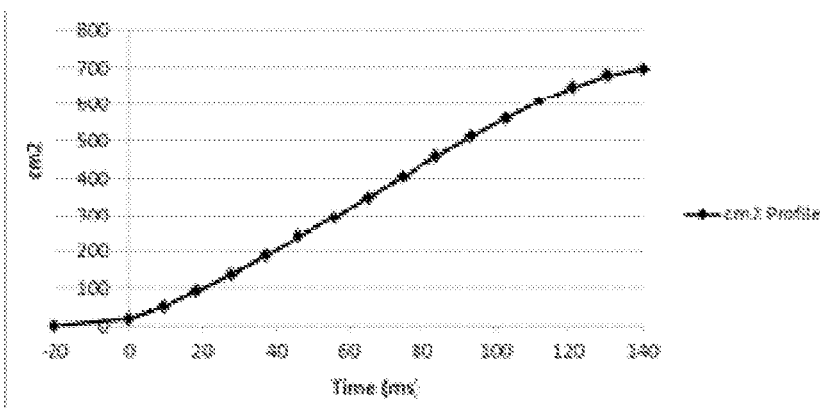
FIG. 4A is a graph showing the immersed surface area of a substrate during immersion.
Figure 4B:
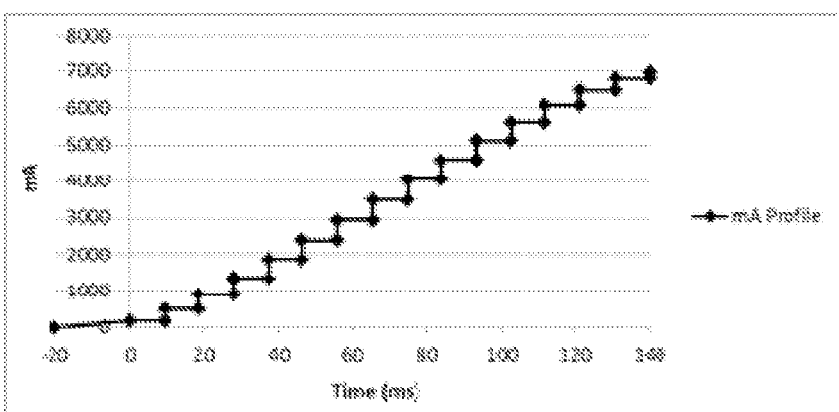
FIG. 4B is a graph showing a current profile applied to a substrate during immersion.
Figure 4C:
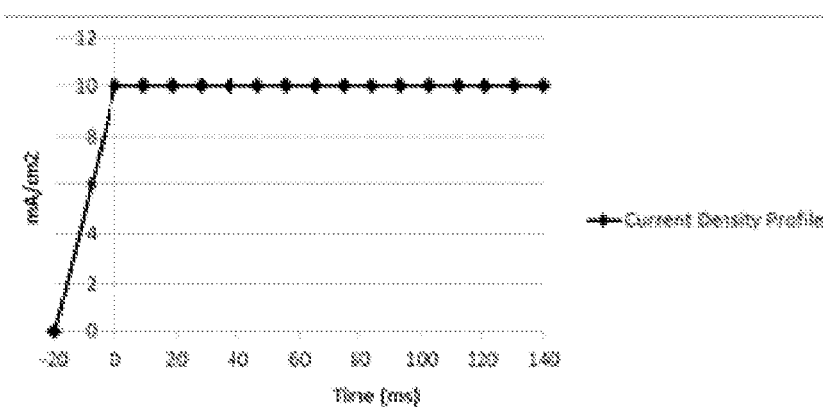
FIG. 4C is a graph showing a current density profile applied to the substrate during immersion, where the substrate immerses according to the immersed area profile of FIG. 4A and the current profile of FIG. 4B.

Once the areal entry profile of the substrate is known, a current profile during immersion can be designed. The current profile tracks the amount of current applied to the surface of the substrate over time. The amount of current applied may be controlled using a current generation power supply or supplies. In one approach, the current profile is designed such that the current density is fairly constant during immersion. FIGS. 4A-4C correspond to this constant current density approach. FIG. 4A shows the wafer's immersed area over time for a certain set of entry parameters. In this case, the entry speed is relatively constant at about 6 cm$^2$/ms. The wafer begins entering the plating solution at time=0 ms, and is fully immersed in solution after about 140 ms. It should be noted that due to the geometry of the wafer, a constant entry speed defined in terms of area per time generally corresponds to a non-constant vertical entry speed defined in terms of distance per time. FIG. 4B shows the current delivered to the substrate over time during immersion. Here, the current is ramped up in small increments/steps as the wafer enters the solution. In this example, step increments of 10 ms are shown for ease of visualization, but current may be delivered in steps of about 0.1 ms-30 ms. The desired current at a particular time is calculated based on the immersed area shown in FIG. 4A, in order to produce a constant current density. The use of shorter steps may allow the current density to be more uniform over the course of entry. FIG. 4C shows the current density delivered to the substrate over time during immersion. Because the current was incrementally ramped up as more of the wafer's surface became immersed, the current density is substantially constant over the course of immersion.

Figure 5A:
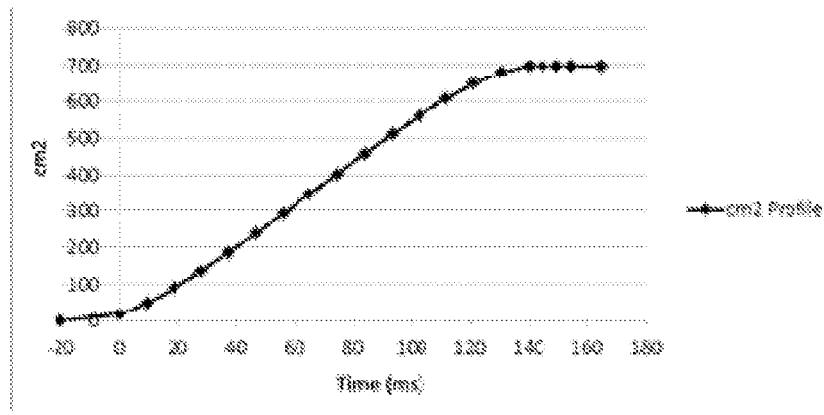
FIGS. 5A-5C show graphs representing the immersed surface area (FIG. 5A), current (FIG. 5B) and current density (FIG. 5C) over time where a current density pulse is used soon after immersion.
Figure 5B:
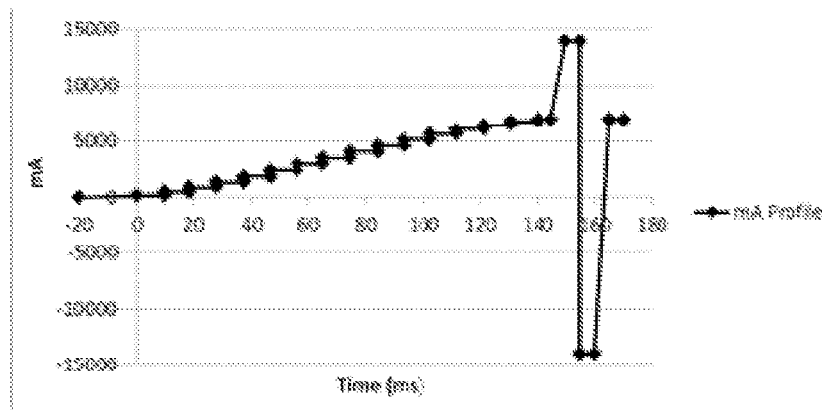
Figure 5C:
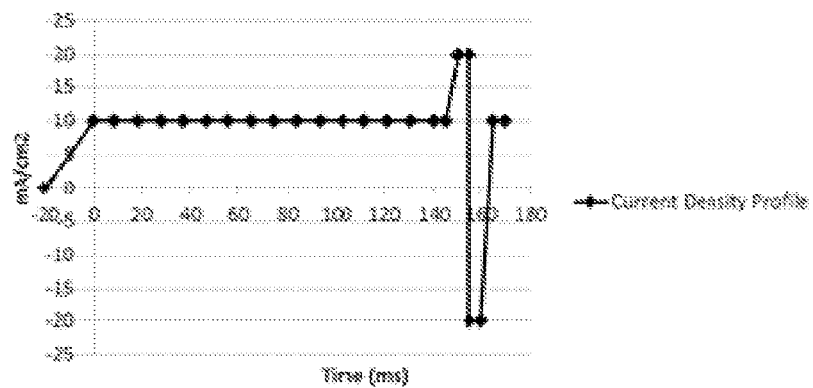

In another implementation, the known immersed area of the wafer may be used to calculate an applied current that will generate a specific applied current density to all points of the wafer during most of the entry process, then a series of one or more forward and/or reverse current pulses are applied to the wafer after or toward the end of immersion or soon after immersion is complete. FIGS. 5A-5C illustrate this approach. The current pulses may be relatively high current pulses, low current pulses, or no current pulses. In certain embodiments, the pulse results from the temporary cessation of current applied to the wafer (i.e., a no current pulse). In some embodiments, instead of the current being pulsed, the current is stepped or otherwise changed to achieve a higher or lower current density than during immersion. Without wishing to be bound by any theory or mechanism of action, it is believed that these pulses/changes in current may be used to alter the initial metal nucleation on the wafer by redistributing the additives adsorbed to the substrate surface.

FIG. 5A shows the immersed area of the wafer over time during immersion. FIG. 5B shows the current profile during immersion. The current incrementally increases as the immersed area of the wafer increases. At time t1, a forward current pulse is applied for a period of time (e.g., 10 ms). The current pulse creates a higher current density at the substrate surface for a brief amount of time and may drive rapid nucleation of metal at the surface. At time t2, the current is reversed for a brief period of time (e.g., 10 ms) to further fine tune the metal nucleation on the substrate surface. At time t3, the current returns to approximately the value it was before the pulse at t1. FIG. 5C shows the resulting current density profile during immersion.

In certain implementations, shorter or longer pulse times may be used (e.g., between about 1 and 30 ms). The pulses may be used to achieve a higher or lower current density (e.g., between about ±0.1 to ±500 mA/cm$^2$). Alternatively, instead of a pulse, the current may be stepped to a higher or lower current density (e.g., between about ±0.1 to ±500 mA/cm$^2$) where it is held for an amount of time as the wafer completes entry into the electroplating solution. The number, frequency, and magnitude of each pulse/step may be varied as desired. In one embodiment, a single pulse or step is used. In other embodiments, multiple pulses are used (e.g., 2 pulses, 5 or fewer pulses, 10 or fewer pulses, or greater than 10 pulses). In further embodiments, multiple steps are used (e.g., about 2-1000 steps, 5 or more steps, 10 or more steps, 20 or more steps, or about 100 or more steps). As the time between steps decreases, the number of steps will generally increase. Using a high number of steps allows the current density profile to be carefully controlled over time. In certain embodiments, the current is ramped up over time without distinct steps (i.e., the current increases continuously until it reaches a desired level). Further, the frequency and/or magnitude of the pulses/steps may be varied over the course of processing a single substrate. The use of pulsed/stepped current may result in a smoother, more uniform film in certain embodiments.

Figure 6A:
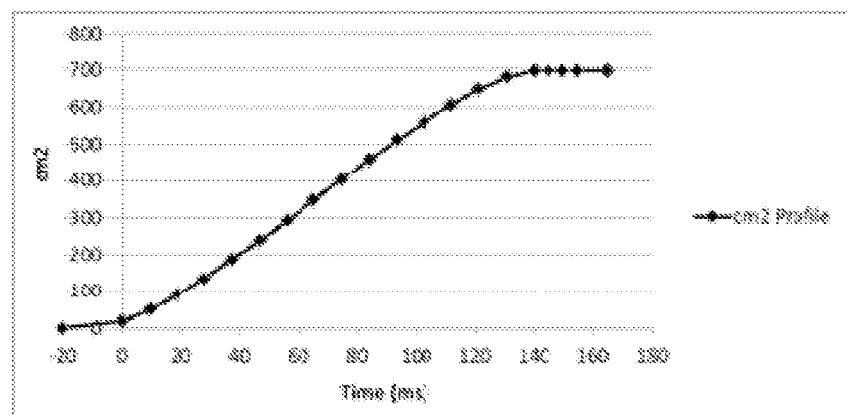
FIGS. 6A-6C show graphs representing the immersed surface area (FIG. 6A), current (FIG. 6B) and current density (FIG. 6C) over time where current density pulses are used during immersion.
Figure 6B:
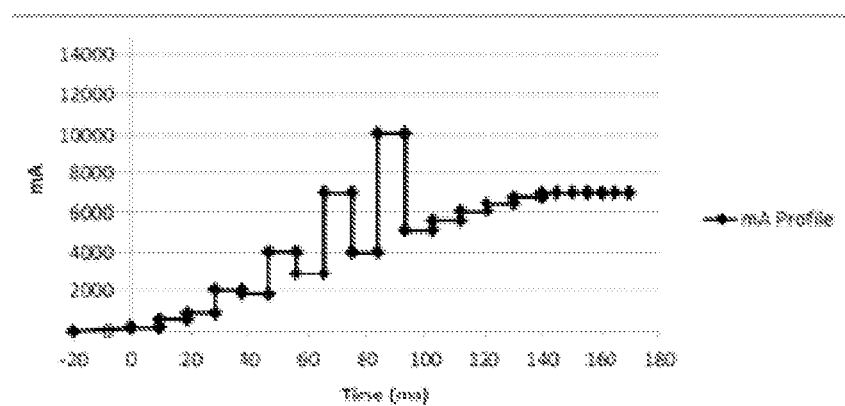
Figure 6C:
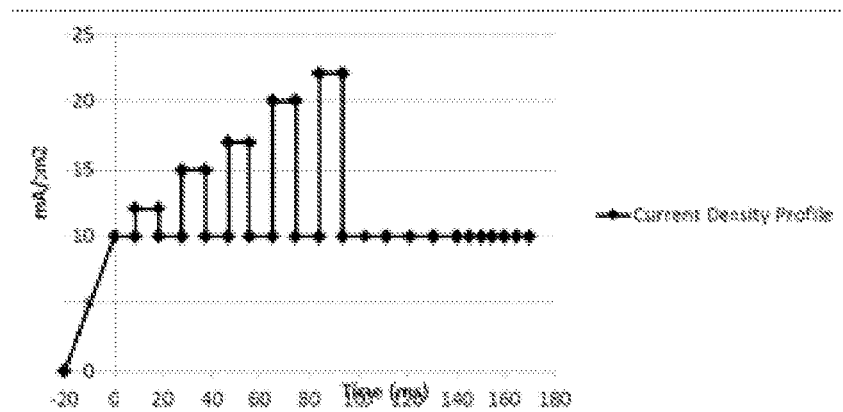

A related implementation involves using other pulse trains or current steps, such as those shown in FIGS. 6A-6C. FIG. 6A shows the immersed area over time during immersion. FIG. 6B shows one example of a current pulse train applied to the wafer during immersion. In this example, a series of increasing current pulses is applied. FIG. 6C shows the current density resulting from the applied current shown in FIG. 6B. In various embodiments, the current is pulsed and/or stepped as the wafer enters the bath, resulting in current density pulses and/or steps over the course of immersion. In some implementations, the current pulses and/or steps begin when the wafer first enters the plating solution. In other implementations, the pulses/steps do not begin until a period of time after the wafer begins immersing (e.g., about 1 ms, about 5 ms, or about 10 ms after the wafer begins immersing), or until a certain portion of the wafer is immersed (e.g., after about 5%, about 10%, or about 50% of the wafer is immersed). The pulses may be forward pulses or reverse pulses, and they may be high current, low current, or no current. A reverse pulse may result in the removal of small amounts of metal from the surface, which may be beneficial in certain implementations. The pulses may last between about 1 and 30 ms or longer, and may occur over the entire course of immersion or only during a portion of the immersion. The pulses/steps may be used to achieve higher or lower current densities (e.g., between about ±0.1 to ±500 mA/cm$^2$). This implementation may be combined with the previous approach to enable current pulsing and/or stepping both during wafer immersion and soon after wafer immersion in order to better control metal nucleation on the wafer surface. In certain embodiments, multiple pulses are used (e.g., 2 pulses, 5 or fewer pulses, 10 or fewer pulses, or greater than 10 pulses). In further embodiments, multiple steps are used (e.g., about 2-1000 steps, 5 or more steps, 10 or more steps, about 20 or more steps, or about 100 or more steps). In some cases, both pulses and steps are used during immersion.

By utilizing these techniques to dynamically control the current applied to wafers as they enter a plating bath, it is possible to control, e.g., metal nucleation at the wafer surface and thereby obtain smoother, more uniform metal depositions. In order to calculate the roughness of the plated surface, light scattering images such as that shown in FIG. 3 may be used to directly correlate reflexivity maps (i.e., haze maps) to Atomic Force Microscopy (AFM) roughness data. A calibration curve may be established between the two pieces of semiconductor metrology, and this technique is further described in U.S. Pat. No. 7,286,218, incorporated by reference herein. This type of calibration was used to calculate the Root Mean Squared (RMS) values of roughness disclosed herein. In the haze maps, areas that are brighter are known to correspond to areas of the surface that are rougher, as these areas scatter an increased amount of light as compared to smoother areas of the surface.

Figure 7A:
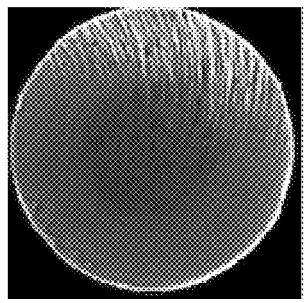
FIGS. 7A-7D, 8A-8C and 9A-9C show light scattering based haze maps for substrates plated at different immersion parameters.
Figure 7A:
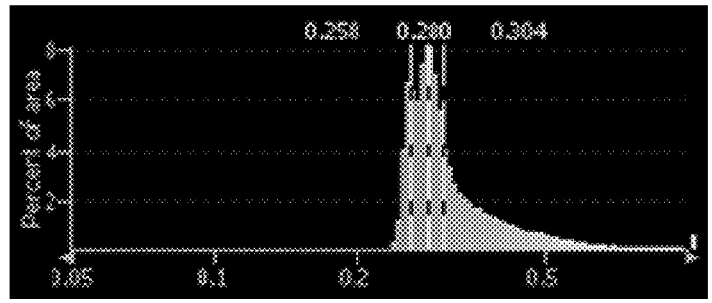
Figure 7B:
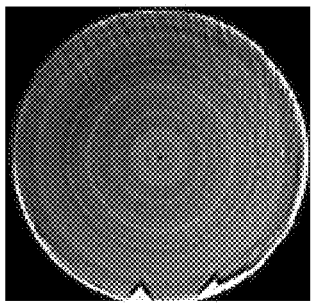
Figure 7B:
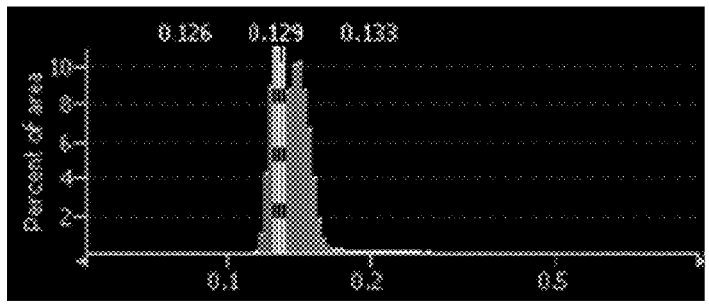
Figure 7C:
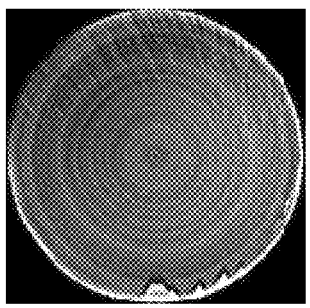
Figure 7C:
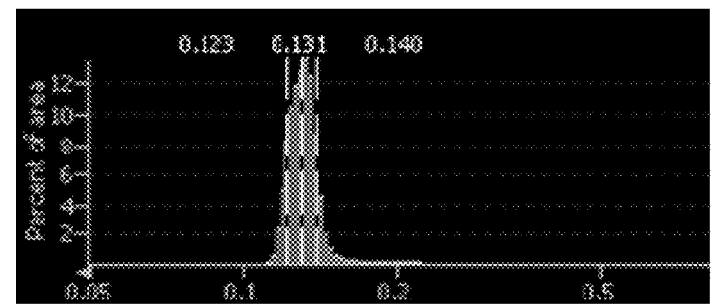
Figure 7D:
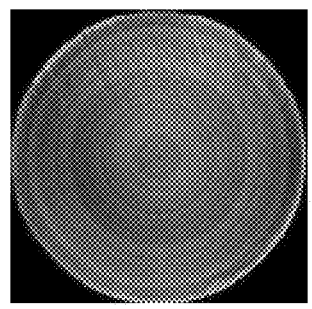
Figure 7D:
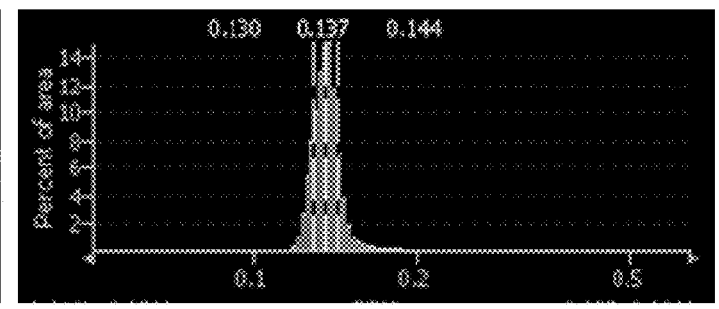

FIGS. 7A-7D show light scattering based haze maps illustrating the wafer surface roughness observed across the wafers (left panels) and the resulting histogram data from these maps (right panels). Smoother surfaces correspond to histograms having narrower distributions centered around lower values. The concentric circles seen in the haze maps of FIGS. 7A-7D (and 8A-8C and 9A-9D) are caused by the metrology tool/method. All entry speeds for FIGS. 7A-7D are 6 cm$^2$/ms. FIG. 7A relates to a wafer plated under conventional potentiostatic entry conditions. The haze map shows significant light scattering, especially at the top of the wafer. Further, the histogram of FIG. 7A is centered around a relatively high value and includes a substantial tail out towards the higher values. The average RMS roughness for the potentiostatic entry condition is calculated from a calibration curve to be 3.43 nm. FIG. 7B relates to a wafer plated at a constant current density of 15 mA/cm$^2$ during immersion according to the technique shown in FIGS. 4B-4C. The haze map of FIG. 7B shows less light scattering than in the potentiostatic entry case of FIG. 7A. Likewise, the histogram of FIG. 7B is centered at a lower value and is narrower than in FIG. 7A. The RMS roughness for the wafer in FIG. 7B is calculated to be 2.50 nm. FIG. 7C relates to a wafer plated at a constant current density of 15 mA/cm2 during the initial immersion period, then plated at a current density of 30 mA/cm$^2$ for the final 50 ms of immersion using a waveform similar to that shown in FIG. 5B-5C (without the reverse pulse). Here, the haze map appears more uniform than in the potentiostatic entry case of FIG. 7A, and the histogram is narrower and centered around a lower value. The average RMS roughness in FIG. 7C is calculated to be 2.51 nm. FIG. 7D relates to a wafer plated at a current density of 15 mA/cm2 during the initial immersion period, then exposed to a series of three 10 ms steps during the final 30 ms of immersion. The first step is a 10 ms pulse at 30 mA/cm$^2$, the second step is a 10 ms pulse at 0 mA/cm$^2$, and the third step is another 10 ms pulse at 30 mA/cm$^2$. Like FIGS. 7B and 7C, the haze map of FIG. 7D appears more uniform than in the potentiostatic entry case of FIG. 7A, and the histogram is narrower and centered around a lower value. The average RMS roughness in FIG. 7D is calculated to be 2.55 nm. The wafers in FIGS. 7B-7D each show an improved surface smoothness as compared to wafer plated under potentiostatic entry conditions in FIG. 7A. The smoothest surface (lowest RMS roughness value) was achieved in the wafer of FIG. 7B, corresponding to the constant current density during immersion (without pulses or steps). However, the RMS values were fairly close between FIGS. 7B-7D, and therefore, each of these techniques may be used to increase surface smoothness/uniformity. The technique used may be chosen based on the specific use or surface of the wafer, the electrolyte used, or various other considerations. The plating conditions and roughness results relating to FIGS. 7A-7D are summarized in Table 1.

TABLE 1

| FIG. | Entry Conditions | Entry Speed (cm$^2$/ms) | Average Calculated RMS Roughness (nm) |
|---|---|---|---|
| 7A | Potentiostatic | 6 | 3.43 |
| 7B | Constant current density at 15 mA/cm$^2$ | 6 | 2.50 |
| 7C | Initially constant current density at 15 mA/cm$^2$, with a step change to 30 mA/cm$^2$ for the last 50 ms of entry | 6 | 2.51 |
| 7D | Initially constant current density at 15 mA/cm$^2$, with a series of 10 ms steps (10 ms at 30 mA/cm$^2$, 10 ms at 0 mA/cm$^2$, 10 ms at 30 mA/cm$^2$) during the last 30 ms of entry | 6 | 2.55 |

Figure 8A:
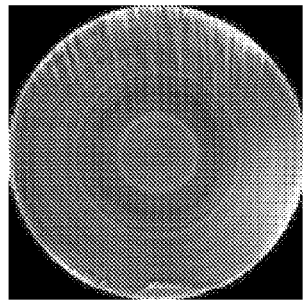
Figure 8A:
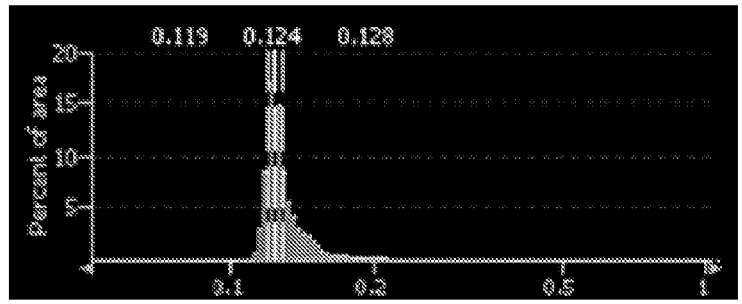
Figure 8B:
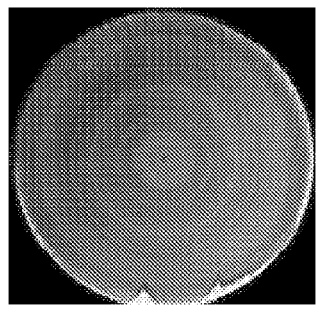
Figure 8B:
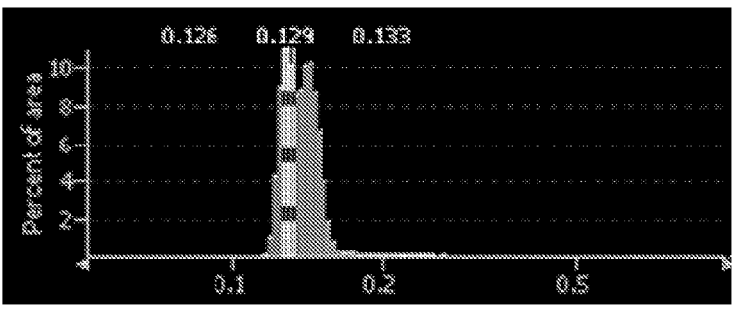
Figure 8C:
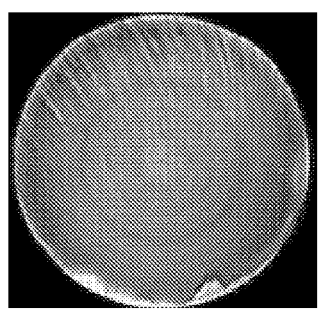
Figure 8C:
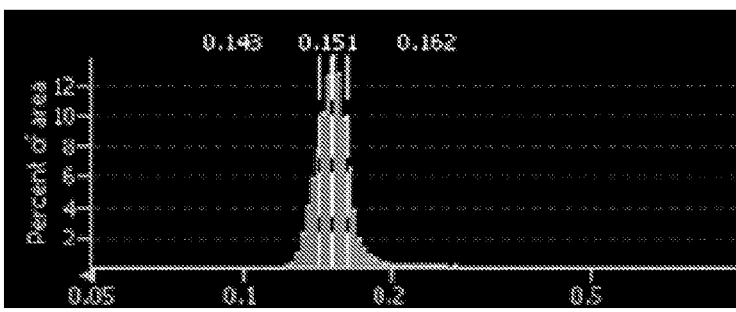

FIGS. 8A-8C show light scattering based haze maps illustrating the wafer surface roughness observed across the wafers (left panels) and the resulting histogram data from these maps (right panels) for a range of applied constant current densities. No current pulses or steps were used in preparing the wafers. FIGS. 8A-8C demonstrate that the surface roughness is directly dependent on the constantly applied current density. Specifically, FIG. 8A relates to a wafer plated at 7.5 mA/cm$^2$, FIG. 8B relates to a wafer plated at 15 mA/cm$^2$, and FIG. 8C relates to a wafer plated at 30 mA/cm$^2$. Over this range, the average roughness increased with increasing current density, and the entry conditions and roughness results are summarized in Table 2. The applied current and current density that provide the best results for a given wafer, however, will depend on the characteristics of the surface to be plated (e.g., seed thickness, seed composition, etc.).

TABLE 2

| FIG. | Entry Conditions | Entry Speed (cm$^2$/ms) | Average Calculated RMS Roughness (nm) |
|---|---|---|---|
| 8A | Constant current density at 7.5 mA/cm$^2$ | 6 | 2.45 |
| 8B | Constant current density at 15 mA/cm$^2$ | 6 | 2.50 |
| 8C | Constant current density at 30 mA/cm$^2$ | 6 | 2.66 |

Figure 9A:
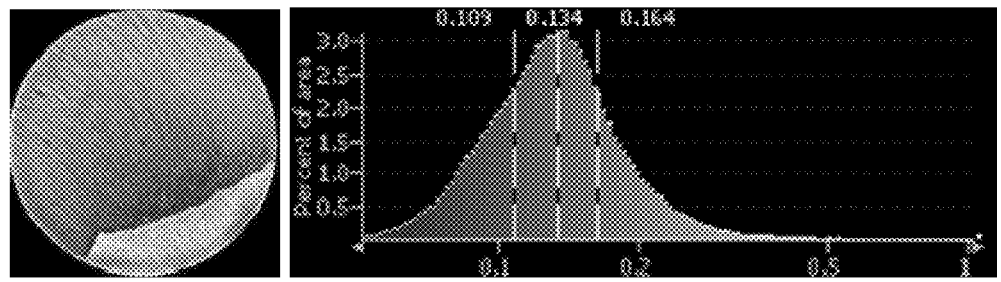
Figure 9B:
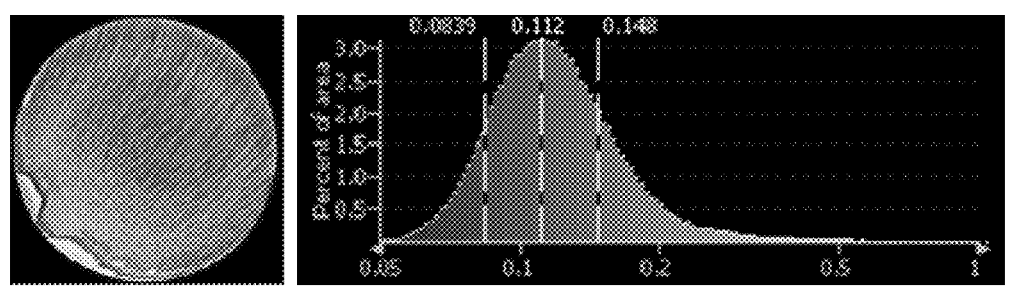
Figure 9C:
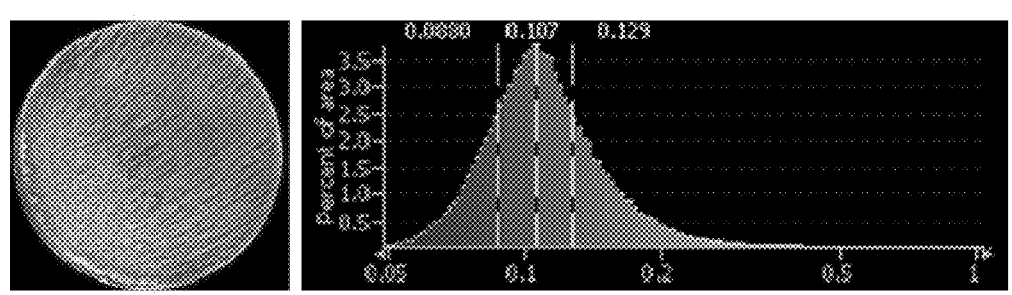
Figure 9D:
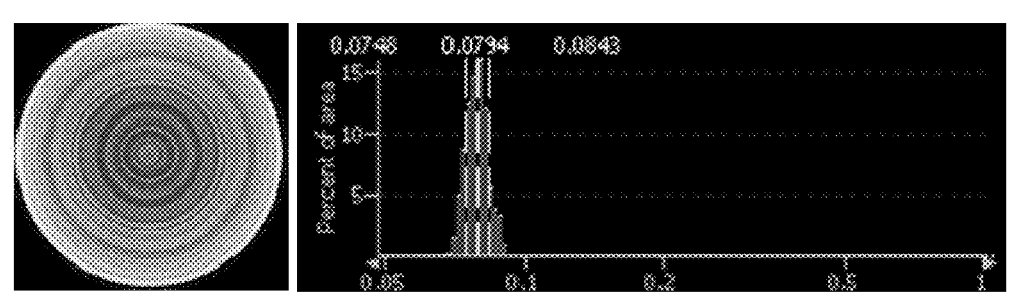
FIG. 9D shows a light scattering based haze map for a bare wafer.

FIGS. 9A-9C show light scattering based haze maps illustrating the wafer surface roughness observed across the wafers (left panels) and the resulting histogram data from these maps (right panels) for a range of entry speeds. FIG. 9D shows the haze maps and resulting histogram from a control bare wafer that was not plated. The wafers relating to FIGS. 9A-9C were all plated at a constant current density of 15 mA/cm$^2$, and no current pulses or steps were used during immersion. The entry speeds for these wafers were 3 cm$^2$/ms (FIG. 9A), 6 cm$^2$/ms (FIG. 9B), and 7.5 cm$^2$/ms (FIG. 9C). Over this range, the surface roughness decreased with increasing entry speed. In other words, faster entry speeds resulted in smoother plated surfaces. The control wafer is included to illustrate the inherent roughness present in a bare wafer (about 2.05 nm), and to show that the higher entry speeds (e.g., 7.5 cm$^2$/ms) generate plated films that are only slightly more rough than the underlying surface. The entry conditions and resulting roughness are summarized in Table 3.

TABLE 3

| FIG. | Entry Conditions | Entry Speed (cm$^2$/ms) | Average Calculated RMS Roughness (nm) |
|---|---|---|---|
| 9A | Constant current density at 15 mA/cm$^2$ | 3 | 2.53 |
| 9B | Constant current density at 15 mA/cm$^2$ | 6 | 2.35 |
| 9C | Constant current density at 15 mA/cm$^2$ | 7.5 | 2.30 |
| 9D | No plating (bare wafer) | — | 2.05 |

Figure 10:
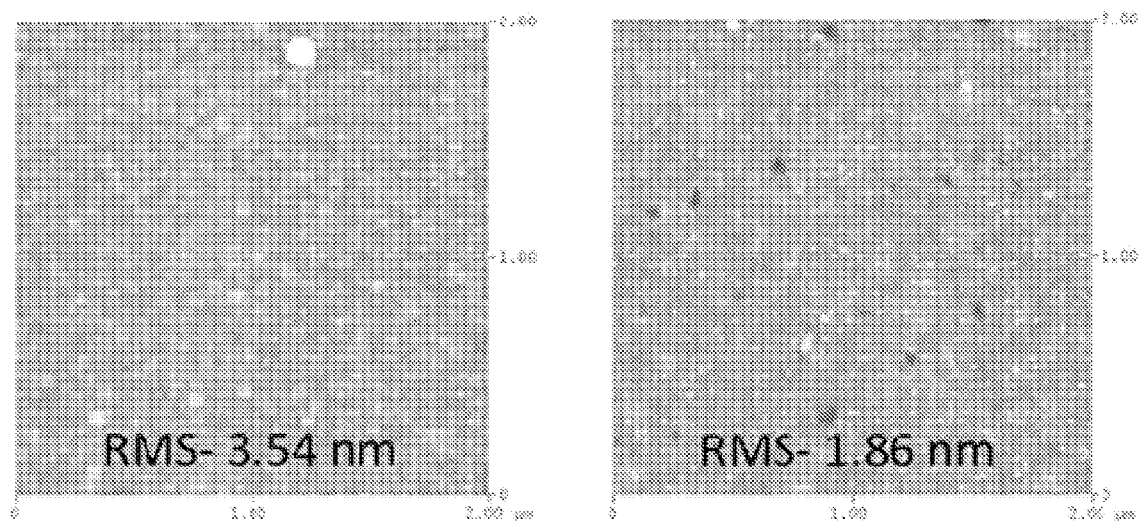
FIG. 10 shows AFM images of copper electrodeposited at different immersion parameters.

FIG. 10 provides additional support showing that smoother surfaces result when using dynamic current ramping entry techniques as compared to conventional potentiostatic entry techniques. Specifically, FIG. 10 shows representative AFM images of copper deposited using a potentiostatic entry (left), and a dynamic current ramping entry (right). The average RMS roughness values were calculated at three different points on each wafer: (1) near the entry edge of the wafer (i.e., the portion of the wafer that enters the plating bath first), (2) near the middle of the wafer, and (3) near the immersion edge of the wafer (i.e., the portion of the wafer that enters the plating bath last). These wafer positions are also shown in FIG. 1B. The calculated roughness values at these locations are summarized in Table 4, which also includes data related to a bare, unpatterned seed.

TABLE 4

| Entry Condition | Roughness near wafer's entry edge (nm) | Roughness near wafer's center (nm) | Roughness near wafer's immersion edge (nm) |
|---|---|---|---|
| Potentiostatic entry | 4.03 | 3.54 | 4.01 |
| Current ramping entry | 2.27 | 1.86 | 2.58 |
| Bare, unpatterned seed | 1.15 | 1.12 | 1.25 |

Figure 11:
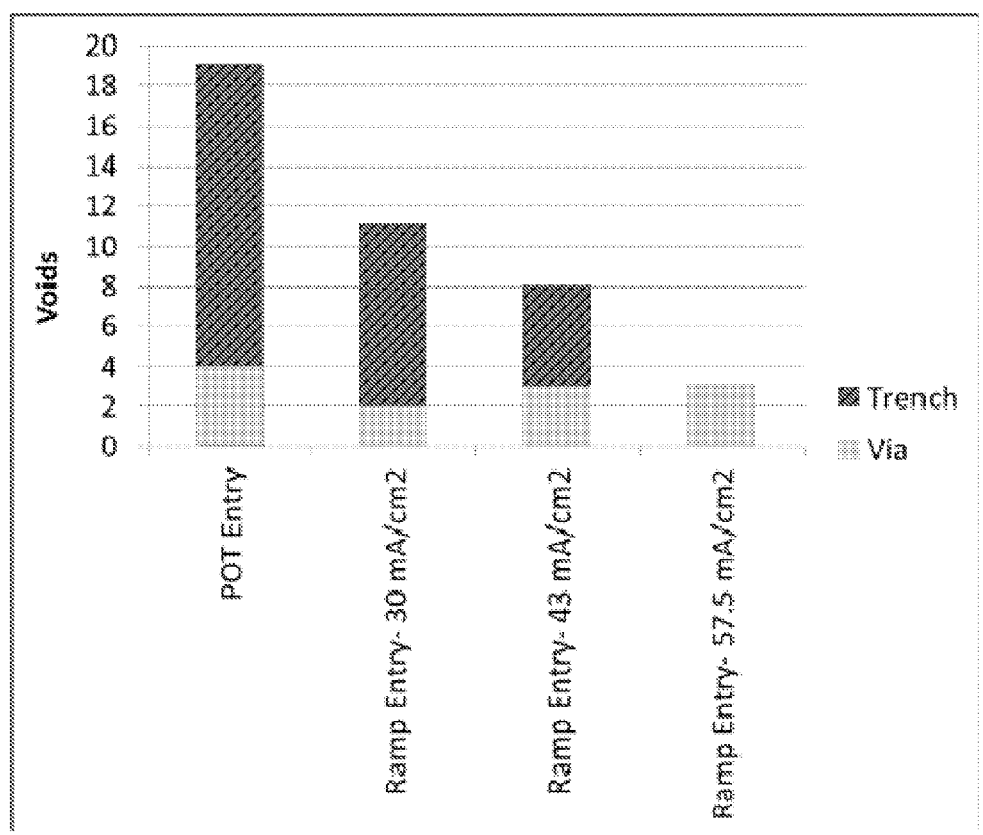
FIG. 11 shows a graph illustrating the number of voids in trenches and vias for different immersion parameters.

FIG. 11 shows a bar graph demonstrating that dynamic current ramped entry provides a reduction in the number of voids observed in features. The potentiostatic entry (POT) showed the highest number of voids at 19. The current ramped entries showed fewer observable voids, particularly in trench features. Within the set of current ramped entry cases, the number of observable voids decreased with increasing current density. The samples used in FIG. 11 were not chemically mechanically polished. Therefore, the reduction in voids is a direct result of the current ramped entry technique and the correspondingly improved control of the high current densities applied to the wafer during entry to minimize seed dissolution and drive rapid nucleation of metal.

The embodiments disclosed herein provide improved methods of electroplating metal onto a substrate. By accounting for the area of the wafer that is immersed at any given time during the immersion process, several benefits are realized. These benefits include improved control of the current density applied across the substrate as it enters the electrolyte, decreased overall surface roughness of the plated surface, improved protection of the seed layer, fewer voids, and better control over the nucleation of metal on the substrate surface. By producing plated metal films with smoother surfaces, the number of defects introduced through chemical mechanical polishing techniques (which arise when polishing surfaces of non-uniform thickness) will be significantly reduced.

Apparatus

Figure 12:
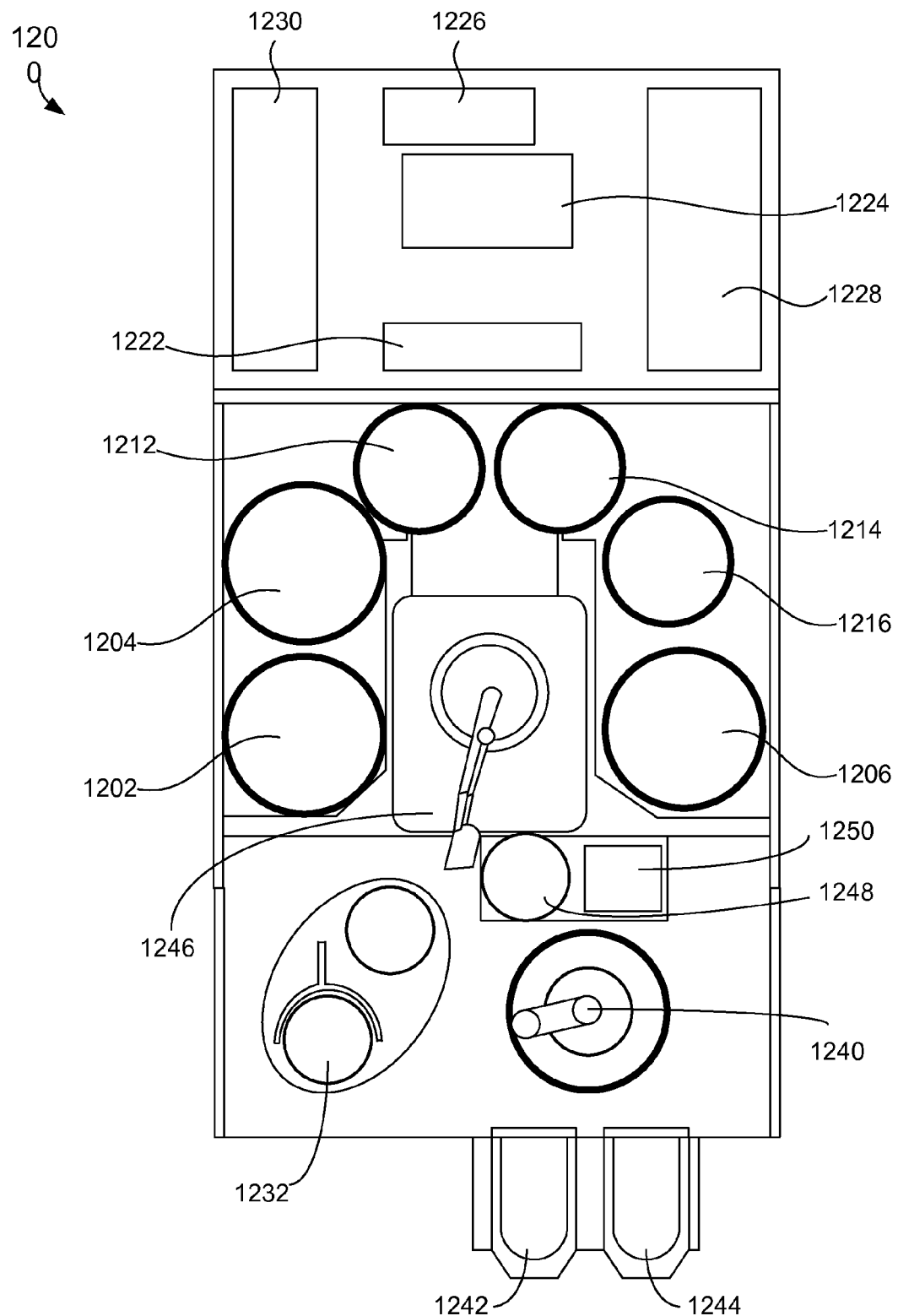
FIGS. 12 and 13 illustrate examples of multi-tool electroplating apparatus that may be used to implement the disclosed embodiments.

Some of the electrodeposition methods disclosed herein can be described in reference to, and may be employed in the context of, various electroplating tool apparatuses. Electrodeposition, including substrate immersion, and other methods disclosed herein can be performed in components that form a larger electrodeposition apparatus. FIG. 12 shows a schematic of a top view of an example electrodeposition apparatus. The electrodeposition apparatus 1200 can include three separate electroplating modules 1202, 1204, and 1206. The electrodeposition apparatus 1200 can also include three separate modules 1212, 1214, and 1216 configured for various process operations. For example, in some embodiments, one or more of modules 1212, 1214, and 1216 may be a spin rinse drying (SRD) module and module 1214. In other embodiments, one or more of the modules 1212, 1214, and 1216 may be post-electrofill modules (PEMs), each configured to perform a function, such as edge bevel removal, backside etching, and acid cleaning of substrates after they have been processed by one of the electroplating modules 1202, 1204, and 1206.

The electrodeposition apparatus 1200 includes a central electrodeposition chamber 1224. The central electrodeposition chamber 1224 is a chamber that holds the chemical solution used as the electroplating solution in the electroplating modules 1202, 1204, and 1206. The electrodeposition apparatus 1200 also includes a dosing system 1226 that may store and deliver additives for the electroplating solution. A chemical dilution module 1222 may store and mix chemicals to be used as an etchant. A filtration and pumping unit 1228 may filter the electroplating solution for the central delectrodeposition chamber 1224 and pump it to the electroplating modules.

A system controller 1230 provides electronic and interface controls required to operate the electrodeposition apparatus 1200. The system controller 1230 (which may include one or more physical or logical controllers) controls some or all of the properties of the electroplating apparatus 1200. The system controller 1230 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1230 or they may be provided over a network. In certain embodiments, the system controller 1230 executes system control software.

The system control software in the electrodeposition apparatus 1200 may include instructions for controlling the timing, mixture of electrolyte components, inlet pressure, plating cell pressure, plating cell temperature, substrate temperature, current and potential applied to the substrate and any other electrodes, substrate position, substrate rotation, and other parameters of a particular process performed by the electrodeposition apparatus 1200. Specifically, the system control logic may also include instructions for immersing the substrate and applying current tailored to provide substantially uniform current density on the face of the substrate during the entire immersion process. The control logic may also provide instructions pulsing the current to the substrate during and/or after immersion. System control logic may be configured in any suitable way. For example, various process tool component sub-routines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an electroplating process may include one or more instructions for execution by the system controller 1230. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

The control logic may be divided into various components such as programs or sections of programs in some embodiments. Examples of logic components for this purpose include a substrate positioning component, an electrolyte composition control component, a pressure control component, a heater control component, and a potential/current power supply control component.

In some embodiments, there may be a user interface associated with the system controller 1230. The user interface may include a display screen, graphical software displays of the apparatus and/or process conditions, and user input devices such as pointing devices, keyboards, touch screens, microphones, etc.

In some embodiments, parameters adjusted by the system controller 1230 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1230 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment, the instructions can include inserting the substrate in a wafer holder, tilting the substrate, applying cathodic current to the substrate during immersion to provide substantially constant current density during immersion, and electrodepositing a copper containing structure on a substrate.

A hand-off tool 1240 may select a substrate from a substrate cassette such as the cassette 1242 or the cassette 1244. The cassettes 1242 or 1244 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1240 may hold the substrate using a vacuum attachment or some other attaching mechanism.

The hand-off tool 1240 may interface with a wafer handling station 1232, the cassettes 1242 or 1244, a transfer station 1250, or an aligner 1248. From the transfer station 1250, a hand-off tool 1246 may gain access to the substrate. The transfer station 1250 may be a slot or a position from and to which hand-off tools 1240 and 1246 may pass substrates without going through the aligner 1248. In some embodiments, however, to ensure that a substrate is properly aligned on the hand-off tool 1246 for precision delivery to an electroplating module, the hand-off tool 1246 may align the substrate with an aligner 1248. The hand-off tool 1246 may also deliver a substrate to one of the electroplating modules 1202, 1204, or 1206 or to one of the three separate modules 1212, 1214, and 1216 configured for various process operations.

An example of a process operation according to the methods described above may proceed as follows: (1) electrodeposit copper onto a substrate to form a copper containing structure in the electroplating module 1204; (2) rinse and dry the substrate in SRD in module 1212; and, (3) perform edge bevel removal in module 1214.

An apparatus configured to allow efficient cycling of substrates through sequential plating, rinsing, drying, and PEM process operations may be useful for implementations for use in a manufacturing environment. To accomplish this, the module 1212 can be configured as a spin rinse dryer and an edge bevel removal chamber. With such a module 1212, the substrate would only need to be transported between the electroplating module 1204 and the module 1212 for the copper plating and EBR operations.

Figure 13:
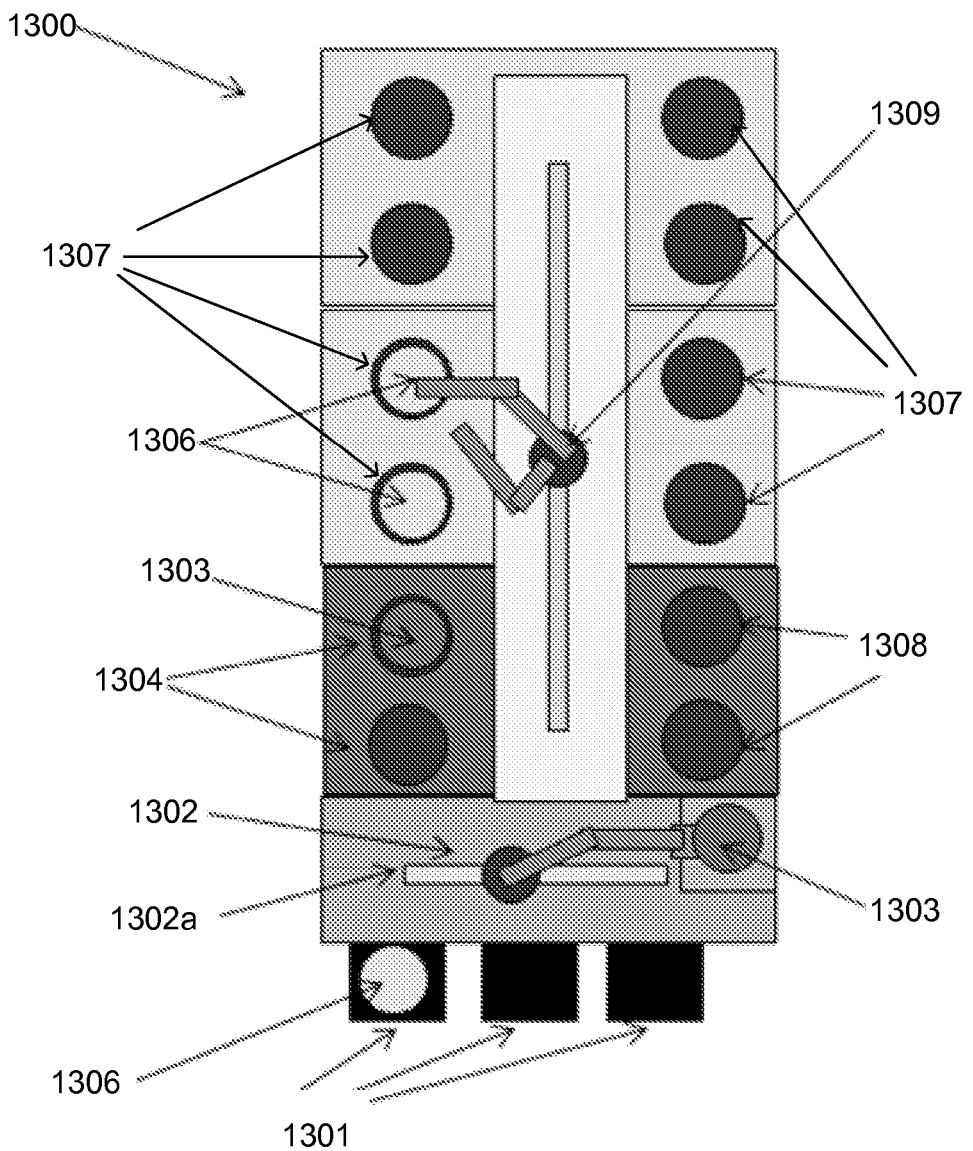

An alternative embodiment of an electrodeposition apparatus 1300 is schematically illustrated in FIG. 13. In this embodiment, the electrodeposition apparatus 1300 has a set of electroplating cells 1307, each containing an electroplating bath, in a paired or multiple "duet" configuration. In addition to electroplating per se, the electrodeposition apparatus 1300 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1300 is shown schematically looking top down in FIG. 13, and only a single level or "floor" is revealed in the figure, but it is to be readily understood by one having ordinary skill in the art that such an apparatus, e.g. the Novellus Sabre™ 3D tool, can have two or more levels "stacked" on top of each other, each potentially having identical or different types of processing stations.

Referring once again to FIG. 13, the substrates 1306 that are to be electroplated are generally fed to the electrodeposition apparatus 1300 through a front end loading FOUP 1301 and, in this example, are brought from the FOUP to the main substrate processing area of the electrodeposition apparatus 1300 via a front-end robot 1302 that can retract and move a substrate 1306 driven by a spindle 1303 in multiple dimensions from one station to another of the accessible stations—two front-end accessible stations 1304 and also two front-end accessible stations 1308 are shown in this example. The front-end accessible stations 1304 and 1308 may include, for example, pre-treatment stations, and spin rinse drying (SRD) stations. Lateral movement from side-to-side of the front-end robot 1302 is accomplished utilizing robot track 1302a. Each of the substrates 1306 may be held by a cup/cone assembly (not shown) driven by a spindle 1303 connected to a motor (not shown), and the motor may be attached to a mounting bracket 1309. Also shown in this example are the four "duets" of electroplating cells 1307, for a total of eight electroplating cells 1307. The electroplating cells 1307 may be used for electroplating copper for the copper containing structure and electroplating solder material for the solder structure. A system controller (not shown) may be coupled to the electrodeposition apparatus 1300 to control some or all of the properties of the electrodeposition apparatus 1300. The system controller may be programmed or other configured to execute instructions according to processes described earlier herein.

The electroplating apparatus/methods described hereinabove may be used in conjunction with lithographic patterning tools or processes, for example, for the fabrication or manufacture of semiconductor devices, displays, LEDs, photovoltaic panels and the like. Generally, though not necessarily, such tools/processes will be used or conducted together in a common fabrication facility. Lithographic patterning of a film generally comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

Some aspects of the disclosed embodiments may be characterized by the following sequence: (a) receiving a substrate containing a thin conductive seed layer, where the seed layer is electrically connected to a power supply; (b) contacting a portion of the seed layer in an electroplating solution while applying a cathodic current to the seed layer; (c) gradually immersing the remainder of the seed layer in the electroplating solution while adjusting the magnitude of the cathodic current applied to the seed layer. In this sequence the cathodic current profile applied to the seed layer during immersion provides a substantially uniform current density to immersed portion of the seed layer during immersion. In some embodiments, the substrate is a circular or substantially circularly-shaped wafer. In some embodiments, the substrate is a 300 mm or 450 mm semiconductor wafer. A substantially uniform current density is typically one that does not vary by more than about 10% or about 5% during the immersion process. However, in some embodiments, current density pulses are interposed on the substantially uniform current density. These pulses, which have magnitudes substantially greater than that of the baseline current density, do not factor into the calculation of the substantially uniform current density.

Frequently, though not necessarily, the substrate is held at a tilt angle during immersion (e.g., 1-5° from the horizontal). The tilt angle may be constant or may vary during immersion. In some embodiments, the seed layer has an average thickness of at most about 100 nanometers. Further, the seed layer may conformally (or substantially conformally) cover a surface having recesses such as trenches, vias, and/or pads. The trenches and/or vias may part of a damascene metallization layer. In some implementations, the recesses may have openings on the order of nanometers (e.g., tens of nanometers). The seed layer may be formed by a process such as PVD (physical vapor deposition).

The current profile may provide a current density of between about 0.1 and 1500 mA/cm$^2$ on the immersed portion of the seed layer. When applied, pulses may have a duration of, e.g., between about 1 and 30 ms. In some implementation, the pulses may provide a current density between about +0.1 to +500 mA/cm$^2$ from a baseline current density. In some embodiments, no current flows during pulsing.

Some aspects of the disclosed embodiments pertaining to apparatus may be characterized by the following features: (a) an electroplating cell; (b) a substrate holder configured to (i) deliver electrical current to a seed layer of a substrate when held in the substrate holder, and (ii) move the substrate by rotation, tilt with respect to horizontal, and immersion in an electroplating bath in the electroplating cell; and (c) a controller configured to provide a current profile that produces a substantially uniform current density on the immersed portions of the seed layer during immersion. The controller may be further configured to introduce pulses to the current density on the seed layer and perform the various operations associated with immersion as described herein.

It should also be noted that there are many alternative ways of implementing the disclosed methods and apparatuses. It is therefore intended that this disclosure be interpreted as including all such alterations, modifications, permutations, and substitute equivalents as fall within the true spirit and scope of the disclosed implementations.

What is claimed is:

1. An apparatus for electroplating metal onto a surface of a substrate, comprising:
an electroplating chamber for holding electrolyte;
a substrate holder for supporting a substrate during electroplating;
a power supply for applying current to the substrate during electroplating; and
a controller comprising one or more memory devices and one or more processors to store and execute instructions, respectively, the controller having instructions to:
position the substrate at an angle relative to a surface of electrolyte in the electroplating chamber;
select a set of immersion parameters that define how the substrate is to be immersed in electrolyte during electroplating;
determine an entry profile for the substrate at the set of immersion parameters, wherein the entry profile provides information about how much substrate area is immersed at different points in time during immersion of the substrate in electrolyte, wherein the entry profile is or was determined experimentally by:
providing a test substrate;
immersing the test substrate in electrolyte at the set of immersion parameters;
while immersing the test substrate, applying a series of current changes to thereby form disrupted plating boundaries on the test substrate, where a time between subsequent current changes is known;
removing the test substrate from electrolyte;
analyzing the test substrate to identify positions of the disrupted plating boundaries; and
determining the entry profile based on the positions of the disrupted plating boundaries and the known time between subsequent current changes;
immerse the substrate in electrolyte in the electroplating chamber such that a leading edge of the substrate enters electrolyte before a trailing edge of the substrate, where the leading and trailing edges of the substrate are positioned opposite one another;
apply a current to the substrate as it is immersed, where a current profile applied to the substrate during immersion is determined based on the entry profile for the substrate; and
remove the substrate from the electrolyte.

2. The apparatus of claim 1, wherein the current profile results in a substantially constant current density applied to the substrate during immersion.

3. The apparatus of claim 2, wherein the current profile increases in a continuous manner.

4. The apparatus of claim 2, wherein the current profile increases in a step-wise manner, wherein a duration of the steps is between about 0.1-30 ms.

5. The apparatus of claim 1, wherein the current profile comprises current pulses such that a current density applied to the substrate during immersion pulses between a substantially constant current density and an increased current density.

6. The apparatus of claim 5, wherein a magnitude of the increased current density pulses increases during immersion.

7. The apparatus of claim 1, wherein the current profile comprises one or more pulses and/or steps.

8. The apparatus of claim 7, wherein the one or more pulses and/or steps occur over only a portion of an immersion process.

9. The apparatus of claim 8, wherein the one or more pulses and/or steps occur during a final portion of immersion or shortly after immersion is complete.

10. The apparatus of claim 7, wherein the one or more pulses and/or steps begin as a wafer is first immersed in electrolyte.

11. The apparatus of claim 7, wherein the one or more pulses and/or steps occur over an entire immersion process.

12. The method of claim 7, wherein the current profile comprises at least one forward pulse and at least one reverse pulse.

13. A method of electroplating metal onto a substrate, comprising:
positioning the substrate at an angle relative to a surface of electrolyte in an electroplating chamber;

selecting a set of immersion parameters that define how the substrate is to be immersed in electrolyte during electroplating;

determining an entry profile for the substrate at the set of immersion parameters, wherein the entry profile provides information about how much substrate area is immersed at different points in time during immersion of the substrate in electrolyte, wherein the entry profile is determined experimentally by:

providing a test substrate;

immersing the test substrate in electrolyte at the set of immersion parameters;

while immersing the test substrate, applying a series of current changes to thereby form disrupted plating boundaries on the test substrate, where a time between subsequent current changes is known;

removing the test substrate from electrolyte;

analyzing the test substrate to identify positions of the disrupted plating boundaries;

determining the entry profile based on the positions of the disrupted plating boundaries and the known time between subsequent current changes;

immersing the substrate in electrolyte in the electroplating chamber such that a leading edge of the substrate enters electrolyte before a trailing edge of the substrate, where the leading and trailing edges of the substrate are positioned opposite one another;

applying a current to the substrate as it is immersed, where a current profile applied to the substrate during immersion provides increasing current that increases by an amount determined from an amount of substrate area immersed in electrolyte at a given time; and removing the substrate from the electrolyte.

14. The method of claim 13, wherein analyzing the test substrate to identify positions of the disrupted plating boundaries comprises analyzing light scattering off of the test substrate.

15. The method of claim 13, wherein the immersion parameters comprise a tilt of the substrate during immersion and a vertical entry speed of the substrate during immersion.

16. The method of claim 15, wherein the vertical entry speed is between about 75-600 cm/s, and wherein the tilt is between about 1-5° from the surface of electrolyte.

17. The method of claim 13, wherein the entry profile takes into account substrate surface area contributed by features on the substrate surface.

18. The method of claim 13, wherein the current profile provides a substantially constant current density during immersion.

19. The method of claim 18, wherein the current increases in a continuous manner.

20. The method of claim 18, wherein the current increases in a step-wise manner having steps between about 0.1-30 ms in duration.

21. The method of claim 13, wherein the current profile provides a current density profile that comprises one or more current density steps and/or pulses.

22. The method of claim 21, wherein the current density profile provides a substantially constant current density during most of substrate immersion, and further provides one or more current density pulses and/or steps toward the end of substrate immersion or soon after substrate immersion.

23. The method of claim 21, wherein the one or more current density steps and/or pulses act to remove at least some metal deposited on the substrate.

24. The method of claim 21, wherein the current density profile alternates between a substantially fixed current density and the steps and/or pulses.

25. The method of claim 21, wherein a frequency and/or magnitude of the one or more steps and/or pulses varies over time.

26. The method of claim 25, wherein the magnitude of the steps and/or pulses increases over time.

27. The method of claim 21, wherein the steps and/or pulses begin at least about 1 ms after the leading edge of the substrate enters electrolyte.

28. The method of claim 21, wherein the steps and/or pulses occur over the entire time the substrate is being immersed.

29. The method of claim 13, further comprising electroplating material onto the substrate after immersion is complete, wherein electroplating is conducted at a different current density than what is used during immersion.

* * * * *